United States Patent [19]

Citta et al.

[11] 4,374,437
[45] Feb. 15, 1983

[54] VARIABLE RAMP SPEED TV TUNING SYSTEM FOR RAPID CHANNEL TUNING

[75] Inventors: Richard W. Citta, Portland, Oreg.; Scott L. Falater, Melbourne, Fla.

[73] Assignee: Zenith Radio Corporation, Glenview, Ill.

[21] Appl. No.: 220,619

[22] Filed: Dec. 29, 1980

[51] Int. Cl.³ .................. H04B 1/16; H04N 5/50; H03J 7/06

[52] U.S. Cl. ................... 455/164; 455/182; 455/184; 455/186; 358/193.1; 358/195.1

[58] Field of Search ........ 455/164, 169, 182, 184–186; 358/193.1, 195.1

[56] References Cited

U.S. PATENT DOCUMENTS

| | | |
|---|---|---|
| 3,943,449 | 3/1976 | Hendrickson et al. ............. 455/186 |
| 4,070,629 | 1/1978 | Merrell . |
| 4,105,948 | 8/1978 | Wolkstein . |
| 4,114,100 | 9/1978 | Klank . |
| 4,156,197 | 5/1979 | Merrell . |
| 4,254,506 | 3/1981 | Henderson et al. ............. 455/186 |
| 4,291,413 | 9/1981 | Henderson et al. ............. 455/185 |

Primary Examiner—Jin F. Ng

[57] ABSTRACT

Disclosed is a microcomputer-controlled frequency synthesis television tuning system utilizing variable tuning ramp speeds following channel selection. Channel tuning is expedited by means of three ramping speeds employed during the tuning process. The system initially ramps quickly toward the selected channel and then automatically and incrementally reduces tuning speed as the proper frequency is approached. Once the proper frequency has been reached, the variable ramp speed signal acquisition mode is terminated and an AFC mode is initiated. Large frequency changes are thus made possible over short periods to accomodate widely separated channels efficiently.

5 Claims, 9 Drawing Figures

VARIABLE RAMP SPEED TV TUNING SYSTEM FOR RAPID CHANNEL TUNING

BACKGROUND OF THE INVENTION

This invention relates in general to television tuning systems and in particular to a microcomputer-controlled automatic frequency synthesis television tuning system for rapidly tuning to a selected channel.

With the ever-increasing number of available television channels, increased operating demands are being placed upon television receiver tuning systems. One operating parameter of increasing importance is the ability of the receiver's tuner to rapidly tune from one channel to another selected channel. Today larger inter-channel frequency ranges must be traversed more frequently than heretofore. Decreased channel acquisition time, i.e., the maximum time it takes to tune from any one channel to another, has obvious advantages from the viewer's standpoint.

Frequency synthesizing tuning systems offer many advantages including enhanced tuning accuracy and, as a result, are being employed on an ever increasing basis in current production tuning systems. One frequency synthesizer currently in common use is termed the indirect frequency synthesizing tuning system in that it uses a programmable phase-locked loop for controlling and maintaining a desired output frequency. This tuning approach offers the advantages of relatively low cost, improved frequency stability, and wide bandwidth coverage. The primary limitation of frequency synthesizers incorporating a phase-locked loop relates to their relatively slow inter-channel tuning rate. This operating limitation of frequency synthesizing tuners having a phase-locked loop severely limits their utility in applications involving a very rapid change from one output frequency to another desired output frequency. Thus, there is a substantial need for a tuning system possessing the advantages of a frequency synthesizer with a phase-locked loop while also providing rapid tuning from one channel to another, far-removed channel upon the receipt of the appropriate command from a user.

One example of a rapid tuning circuit for high frequency receivers is disclosed in U.S. Pat. No. 4,114,100 to Klank wherein is described a tuning circuit which compares a first number identifying the frequency of the received channel with a second number provided by an input keyboard which represents the desired channel to which the receiver is to be tuned. Two numbers each representing one of the aforementioned channels are compared digit by digit starting with the most significant digit of each in a comparator which provides three different outputs. One output represents identical frequency inputs provided to it, a second output provides a signal when the digit representation at its one input represents a value larger than that of the digit representation at its other input, and a third output provides a signal when the digit representation at its one input represents a value smaller than that of the digit representation and its other input. The number of reversals of the inequality represented by the output of this comparator determines the respective level of the rate of change of the tuning voltage. The smaller the number of changes in inequality results, i.e., the smaller the difference between the two numbers, the lower the tuning rate. Although capable of rapid tuning, this invention only indirectly tunes to the desired frequency in an oscillatory manner and as a result suffers from inherent inaccuracy over relatively short tuning periods.

Another approach to high speed tuner design is disclosed in U.S. Pat. No. 4,105,948 to Wolkstein wherein is described a two-step frequency synthesizing tuner in which a high speed digital signal provides an initial rapid change in the output frequency of a local oscillator to a value near the desired value followed by a second control voltage coupled to a phase-lock loop to pull the oscillator frequency to the desired output frequency. While this approach is capable of initial rapid tuning, this high speed tuning rate is achieved only at the initial instant of frequency change which is measured in nanoseconds and therefore fails to maintain a high speed tuning change rate for any substantial duration. Still other approaches to a high speed tuning system are disclosed in U.S. Pat. Nos. 4,070,629 and 4,156,197 both to Merrell. In the tuning system described in both of these patents channel acquisition time is reduced by initially overriding the phase comparator in a phase-lock loop and ramping the tuning system toward the desired frequency until that frequency is passed at which time normal phase-lock loop tuning occurs. Thus, when a channel number input is made, the system goes into full ramping, senses when the desired frequency has been passed, operates for a fixed time in a single frequency mode (with a PLL) and releases to a tuning window mode with AFC. The invention is directed to a 100% ramping feature, i.e., driving the varactor-controlled oscillator to rapidly change frequency, until an overshoot condition is detected, which shortens the channel acquisition, or tuning, time. This approach places high demands on overshoot voltage detection which must not only be accurately detected, but also sensed immediately after tuning voltage crossing.

These and other limitations encountered in the prior art are avoided by the present invention which initially ramps quickly toward the selected channel and then automatically and incrementally reduces tuning speed as the proper frequency is approached. This multiple step tuning rate change approach permits direct and accurate tuning to the selected channel.

OBJECTS OF THE INVENTION

Accordingly, it is an object of the present invention to provide an improved television tuning system for rapidly tuning to a selected channel.

It is another object tof the present invention to provide a microcomputer-controlled frequency synthesis television tuning system capable of accurate, near-instantaneous tuning between two widely separated channels.

Still another object of the present invention is to provide a television tuning system in which tuner ramping speed is changed during channel seek in a manner to permit extremely rapid channel acquisition.

BRIEF DESCRIPTION OF THE DRAWINGS

The appended claims set forth those novel features believed characteristic of the invention. However, the invention itself as well as further objects and advantages thereof, will best be understood by reference to the following detailed description of a preferred embodiment taken in conjunction with the accompanying drawings in which:

DESCRIPTION OF THE PREFERRED EMBODIMENTS

Figure 1:
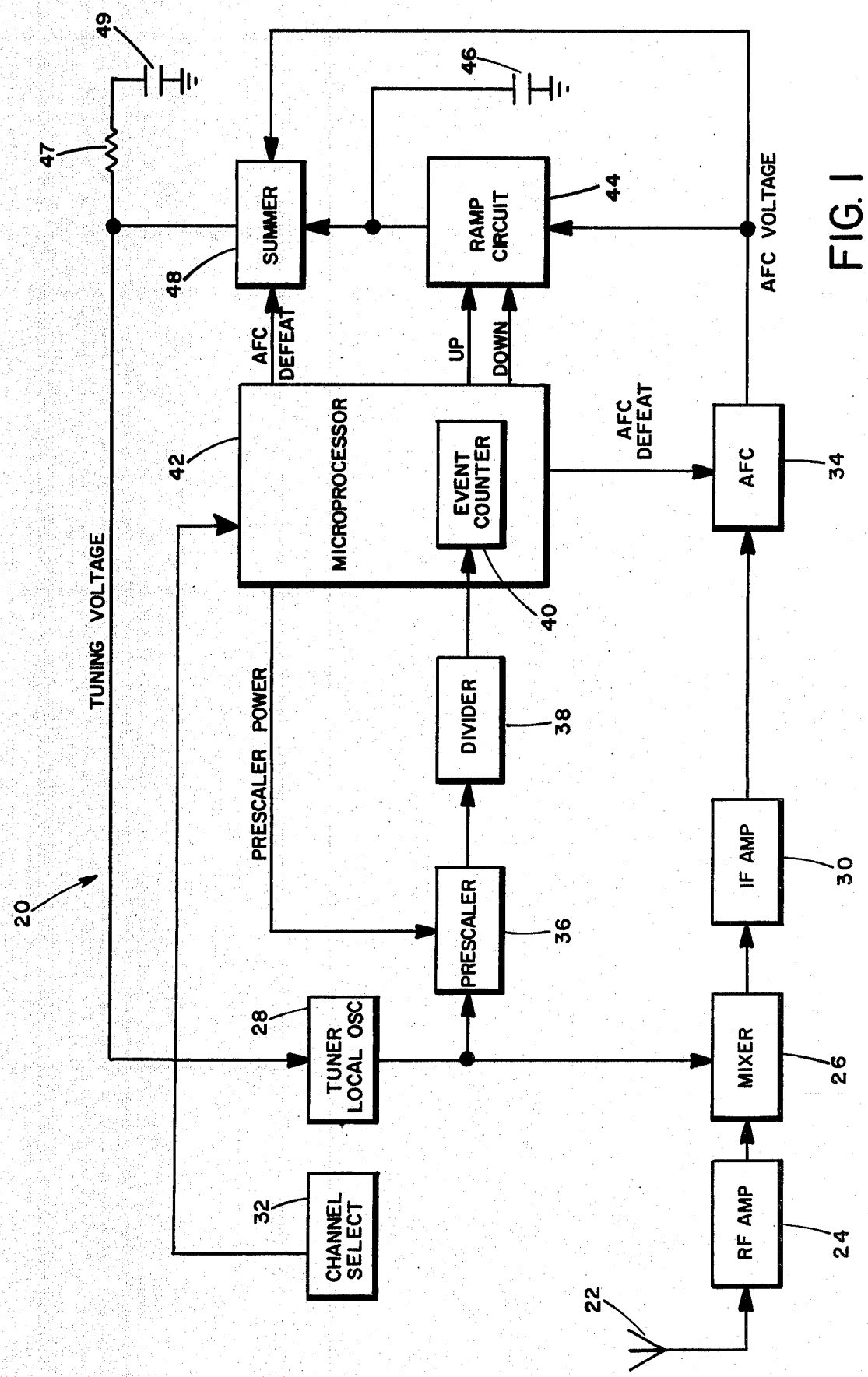
FIG. 1, which is partially in block diagram form and partially in schematic diagram form, shows a variable ramp speed television tuning system for rapid channel tuning in accordance with a preferred embodiment of the present invention.

FIG. 1 shows a variable ramp speed television tuning system for rapid channel tuning 20 in accordance with the present invention. Receiving antenna 22 is coupled to a received, or radio, frequency amplifier 24 which, in turn, is coupled to a mixer 26. Also providing an input to mixer 26 is tuner local oscillator 28 with the output of mixer 26 being an intermediate frequency (IF) signal generated by combining the received signal with the tuner local oscillator signal. The IF signal is then amplified by the IF amplifier 30. Channel select means 32 which may be either a key board entry device or a remote control transmitter operated by the viewer adjusts the frequency of the signal supplied to tuner oscillator 28. It is the signal provided by channel selector 32 to microcomputer 42 which represents the desired television channel. By operation of the familiar heterodyning process in mixer 26, the received radio frequency carrier signal is converted to an IF amplitude modulating carrier which is amplified in amplifier 30 and provided to an automatic frequency control (AFC) system 34. The output of tuner local oscillator 28 is provided sequentially to prescaler 36 and divider 38 in generating a divided-down local oscillator signal which is provided to event counter 40 in microcomputer 42. Microcomputer 42 measures the frequency of the tuner local oscillator signal, compares the tuner local oscillator signal frequency with a predetermined frequency representing the selected channel, determines whether tuner 28 is tuned too high or too low, and issues commands to ramp circuitry 44 to ramp the tuning voltage in the proper direction until the system reaches the desired frequency. This ramping is done using 3 speeds with the system ramping quickly at first and switching to slower speeds as it nears the desired frequency. The output of ramp circuit 44 is transmitted by summer 48 back to tuner local oscillator 28 in tuning the television receiver to the selected channel. Following tuner ramping to the selected channel during the signal acquisition phase of channel tuning, tuning system 20 enters a received signal lock mode employing AFC system 34. AFC 34 then maintains capacitory 46 at the proper voltage level in providing the proper signal level to tuner 28 during the phase lock mode of operation. Capacitor 47 in series with resistor 49 permit rapid signal lock following tuner ramping. These compnents were required because of the AFC system utilized in the preferred embodiment of the present invention which is described in U.S. Pat. No. 4,072,909 to Citta, which is assigned to the assignee of the present invention.

Microcomputer 42 includes a reference crystal which drives a reference oscillator to generate a reference signal. This reference signal is provided to a reference divider which generates a divided-down reference signal to which the divided-down local oscillator signal is locked. Microcomputer 42 also includes a programmable divider which is controlled by data and instructions stored in microcomputer 42 for generating a divided-down local oscillator signal representing the selected channel number. This divided-down local oscillator signal is then compared with the divided-down reference oscillator signal typically in a phase comparator to generate a tuning signal which is then used to control the frequency of the local oscillator output in tuning to the selected channel. These elements will not be described further and are not included in the accompanying drawings because their structure and operation are well known in the art and they are not part of the present invention. One skilled in the art could select from a large number and variety of such elements commercially available and integrate these elements in the present invention using no more skilled than that of one of ordinary skill in the art.

The front end of the variable ramp speed television tuning system 20 including receiving antenna 22, RF amplifier 24, mixer 26, channel selector means 32, tuner local oscillator 28, and IF amplifier 30 may be of conventional design and do not form a part of the present invention and thus will not be described in greater detail. The local oscillator frequency signal is provided to prescaler 36 which is a fixed divide-by 256 prescaler. The output of prescaler 36 is then provided to fixed divide-by 8 divider 38 to reduce the local oscillator signal to a frequency capable of being handled by microcomputer 42. The microcomputer utilized in the present invention is the Single-Chip Microcomputer MK3870 made by various microcomputer manufacturers.

Figure 2:
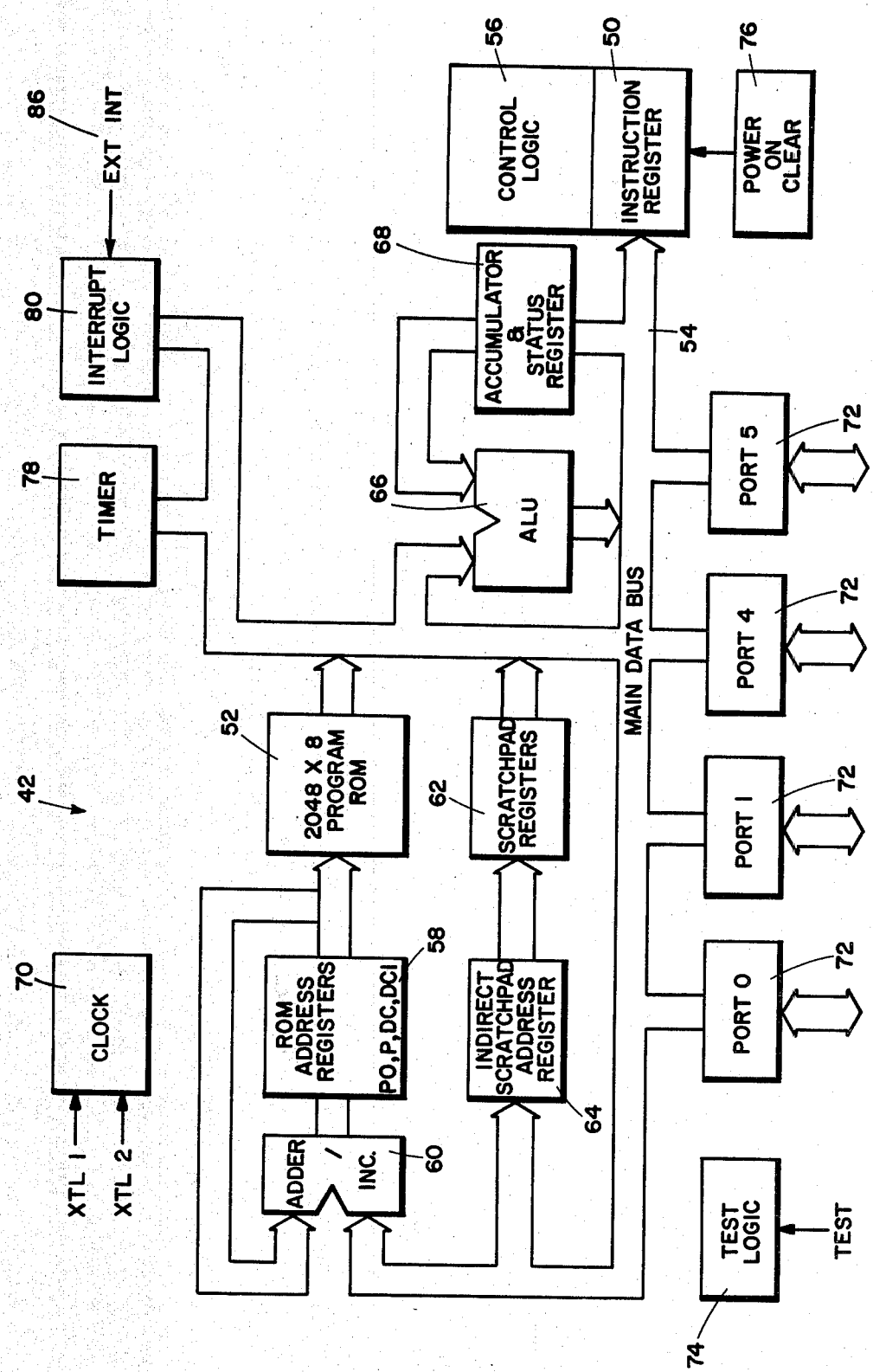
FIG. 2 shows in general a block diagram of the microcomputer utilized in the preferred embodiment of the present invention.

A general description of the operation of the MK3870 Microcomputer follows. Referring to FIG. 2, the instruction register 50 receives the operation code of the instruction to be executed from the program ROM 52 via data bus 54. Once latched into instruction register 50, the main control logic 56 decodes the instruction and provides the necessary control gating signals to all circuit elements. Four 11 bit registers are associated with the 2K×8 ROM 52. These registers (not shown) are the Program Counter for addressing instructions or immediate operands, the Stack Register for saving the contents of the Program Counter during an interupt or subroutine call, the Data Counter for addressing data tables, and the Auxilliary Data counter. Associated with ROM Address Registers 58 is the 11 bit adder/incrementer used to increment the program counter or the data counter and to control various other ROM address register functions. The microcomputer program and data constants are stored in Program ROM 52. Scratch Pad Registers 62 provide 64 8-bit registers which may be used as general purpose RAM memory with Indirect Scratch Pad Address Register 64 as a 6-bit register being used to address the 64 scratch pad registers. After receiving commands from Main Control Logic 56, the Arithmetic and Logic Unit (ALU) 66 performs required arithmetic or logic operations using the data presented on the two input buses and provides the result on the data bus. Accumulator 68 is a principal register for data manipulation within the 3870 Microcomputer and serves as one input to ALU 66 with the results of ALU operation being stored in Accumulator 68. Microcomputer timing is provided by 4 MHz crystal clock 70. Four complete bidirectional input/output ports 72 are provided, with the capability to provide a test input to microcomputer Test Logic 74 also available. When power is applied to the MK3870 microcomputer 42 by means of Power On Clear Control 76 the program counter in ROM Address Register 58 and the interrupt control bit of the status register are cleared. Thus far the operation of the MK3870 Microcomputer has been described in very general terms for this chip is used in a conventional manner in the present invention. For a more detailed description of microcomputer architecture and operation see "Single-Chip Microcomputer MK3870" published by Mostek Corporation of Carrollton, Texas.

Figure 3:
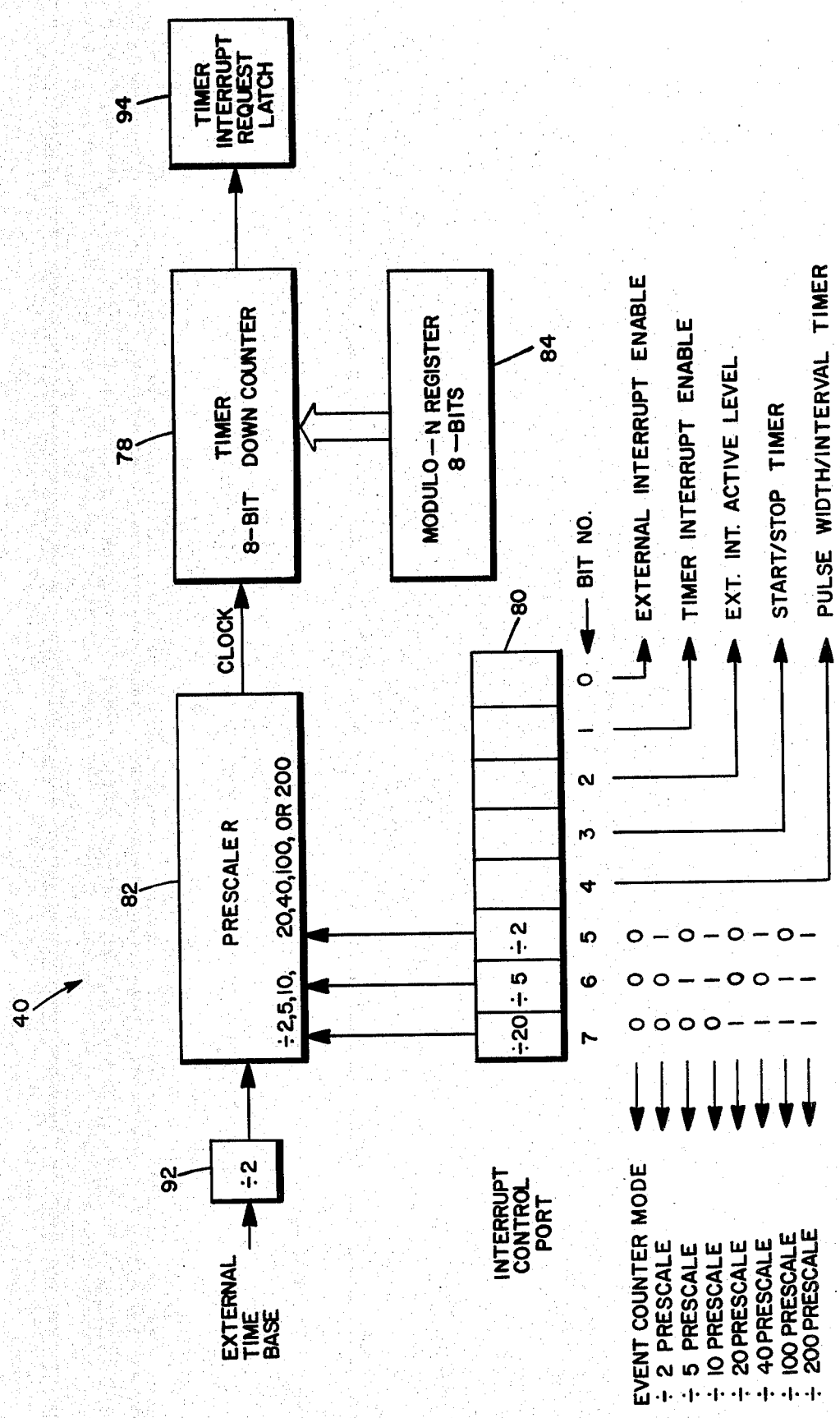
FIG. 3 shows a block diagram of the timer and counter control utilized in the microcomputer shown in FIG. 2.

Timer 78 is an 8-bit binary down counter which is capable of operating in one of 3 modes: the Interval Timer Mode, the Pulse Width Measurement Mode, or the Event Counter Mode. As shown in FIG. 3, there is associated with timer 78 and 8-bit register called the Interrupt Control Port 80, a programmable prescaler 82, and an 8-bit modulo-N register 84. The desired timer mode, prescale value in programmable prescaler 82, the starting and stopping of timer 78, the active level of the EXT INT pin 86, and local enabling or disabling of interrupts are selected by outputting the proper bit configuration from accumulator 68 to interrupt control port 80 with the proper instruction. EXT INT 86 is the external interrupt input which is used in conjunction with timer 78 for pulse width measurement and event counting. An interrupt control bit is used to allow or disallow interrupts in the 3870 Microcomputer. If the interrupt control bit is set and the 3870's interrupt with logic control 88 communicates an interrupt request to the CPU section, the interrupt will be acknowledged and processed upon completion of the first nonprivileged instruction. If the Interrupt Control Bit is cleared, an interrupt request will not be acknowledged or processed until the Interrupt Control Bit is set.

The present invention makes use of the 3870 Microcomputer in its Event Counter Mode which operates in the following manner. When interrupt control port bit 4 is cleared and all prescale bits (interrupt control port bits 5, 6, and 7) are cleared, timer 78 operates in the Event Counter Mode. This mode is used for counting pulses applied to the EXT INT pin 86. If interrupt control port bit 3 is set, timer 78 will decrement on each transition from the inactive level to the active level of EXT INT pin 86. Prescaler 82 is not used in this mode, but as in the other two timer modes, timer 78 may be read at any time, may be stopped at any time by clearing interrupt port bit 3, and the timer interrupt request latch is set on the timer's transition from H "01" to H "N". Normally interrupt control port bit 0 should be kept cleared in the event counter mode, otherwise, external interrupts will be generated on the transition from the inactive level to the active level of EXT INT pin 86. For the event counter mode the minimum pulse width required on EXT INT is two internal clock periods and the minimum inactive time is two internal clock periods; therefore, the maximum repetition rate is 500 KHz.

Referring to FIG. 3 the operation of event counter 40 will now be explained in greater detail. The prescaled and divided-down version of the local oscillator signal is provided to the External Time Base input of microcomputer 42. The local oscillator signal is then divided by 2 by a second divider 92 in microcomputer 42. The output of divider 92 is then provided to prescaler 82 which is controlled by the inputs to interrupt control port 80. When microcomputer 42 is operating in the Event Counter Mode as in the present invention interrupt control port bit 4 is cleared as are all the prescale bits, i.e., interrupt control port bits 5, 6, and 7. Interrupt control port bit 3 is set in this mode and timer 78 decrements on each transition from the inactive level to the active level of the EXT INT pin 86. The output of prescaler 82 is then provided to timer 78 which is an 8-bit down counter and which is preloaded with the contents of modulo-N register 84. The contents of modulo-N register 84 and the process of providing its contents to timer 78 are well known in the art and will not be further discussed here. The contents of modulo-N register 84 and the information provided to timer 78 are a function of the desired channel and are stored in and recalled from the microcomputer's ROM 52. Thus, the contents of modulo-N register 84 determines the channel to be tuned to, the frequency band of the selected channel, and the rate at which tuning for that channel is accomplished as will be explained later. Once counting is initiated, timer 78 counts down to zero and sets timer interrupt request latch 94 once zero is reached. The microcomputer's clock is used as the time base for event counter 40. In the present invention a resolution of one part in a thousand, or ten bits, is provided and in order to obtain this resolution event counter 90 is used over and over until the required resolution is obtained. Thus, once zero is reached in the countdown of timer 78, timer interrupt request latch 94 is set and countdown is re-initiated by timer 78. From the number of times timer 78 is decremented to zero as measured by timer interrupt request latch 94 and by the contents of timer 78 on termination of the counting interval, microcomputer 42 using primarily its ALU 66 and accumulator 68 determines whether the system is tuned too high or too low in frequency. Thus, when timer 78 is decremented to the value zero, it automatically resets itself to the preloaded value provided by modulo-N register 84, and provides an interrupt to timer interrupt request latch 94 and continues to decrement until zero is reached again. The time period during which timer 78 is enabled is determined by the frequency resolution required. The number of interrupts generated during this time period is determined by the channel frequency and the output of modulo-N register 84. If too many interrupts are generated, the frequency of the local oscillator signal is too high, since the counter 40 was decremented too many times. In this case a ramp downward signal is generated and provided to ramping circuit 44. If too few interrupts are generated, the frequency is too low since the counter 40 was decremented too few times, and a ramp up signal is provided to ramping circuit 44. The details of the generation of these ramping signals will be provided in later paragraphs.

As described thus far, the present invention has made use of conventional frequency synthesis tuner techniques as controlled by a microcomputer in generating a tuner voltage correction signal. Microcomputer MK3870 is an off-the-shelf item and is being used in a conventional manner in the present application. However, the present invention involves the specific counting technique utilized in generating a step-type tuning voltage correction signal as applied to ramping circuitry. The details of this unique tuning system are provided in the following paragraphs.

In accordance with the present invention, the maximum ramping speed possible is determined by the frequency resolution required in measuring the local oscillator signal frequency. Because in the present invention event counter 40 is enabled while the system is ramping, ramping speed may not be so fast that the count left over in event counter 40 changes more than one count during one counting interval. By the count left over is meant the residue remaining in event counter 40 at the end of the predetermined counting interval. If the frequency of the local oscillator signal has changed as a result of high speed ramping so much that during one counting interval the count residue has changed by two counts, the system would become unstable and be unable to determine whether to tune up or tune down in attempting to precisely tune to the desired frequency. The degree of frequency resolution required is determined by the interval over which the frequency is measured, or the counting interval, with higher frequency measuring resolution possible with increasing periods of frequency measurement. By thus ramping initially at high speed with a relatively poor frequency measuring resolution, the desired frequency may be rapidly approached and subsequently more accurately acquired by reducing the ramping speed while correspondingly increasing the frequency measuring interval. The present invention thus makes use of three separate ramping speeds each possessing different frequency measurement resolutions and permits the television receiver to initially tune somewhat inaccurately at high speed to the channel while subsequently in a step-wise manner reducing the ramping speed, increasing frequency measuring resolution and more precisely tuning to the selected channel. The operation of the present invention is best shown in the flow diagram of FIG. 4 in which are presented the steps involved in the present invention which are stored and recalled from the microcomputer's ROM 52. Three ramping speeds of decreasing magnitude are successively utilized. The counting intervals and corresponding frequency resolution for the different ramping speeds in the several tuning bands are given in Table 1. These frequency resolutions and ramping speeds are a function of microcomputer operations as depicted in the flow chart shown in FIG. 4.

Figure 4:
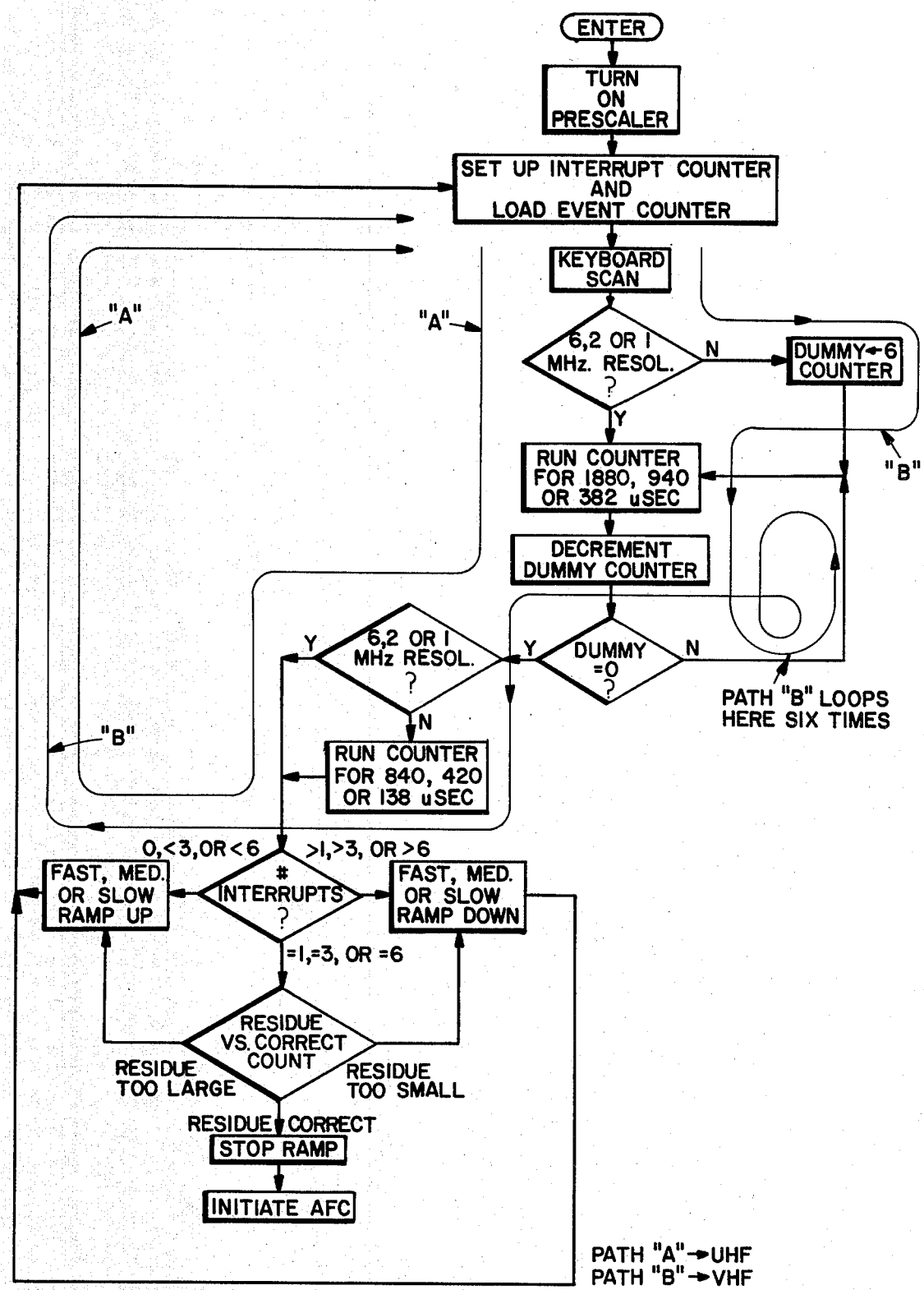
FIG. 4 is a flow chart depicting the steps required in the operation of the variable ramp speed television tuning system for rapid channel tuning shown in FIG. 1.

At the start of a counting loop the variable ramp speed channel tuning routine is entered from the main tuning program controlled by microcomputer 42. At the start of a counting loop, which is shown in FIG. 4, event counter 40 is loaded with the modulo-M from modulo-N register 84. This modulo number represents the selected channel number and is provided to the modulo-N register 84 by microcomputer 42. The event counter is then started and the instructions are counted in a timing loop until a predetermined delay time T is reached. The event counter is then stopped and read. If during the counting time the counter reaches full count M, an interrupt is generated and the event counter 40 is reloaded and starts counting again. Once the rapid tuning subroutine is initiated, prescaler 36 is turned on by a signal received from microcomputer 42. This prescaler "ON" signal is removed once the seek mode is completed and AFC 34 is initiated. This selective turning on and off of prescaler 36 reduces the shielding requirements in tuner 20 since the prescaler 36 is not running during normal viewing. With prescaler 36 turned on, the interrupt counter is set up and event counter 40 is loaded with the appropriate modulo number. The channel selector 32, e.g., a keyboard, is then scanned every 4 msec. The ramping speed is determined by the main tuning program before the flow chart shown in FIG. 4 is entered. The fast UHF loop has a frequency resolution of 6 MHz, the medium speed loop has a frequency resolution of 1 MHz.

TABLE I

| BAND | RAMPING SPEED | COUNTING TIME | FREQUENCY RESOLUTION | RAMPING SPEED |
|---|---|---|---|---|
| LoBand VHF | Slow | 12.288msec | 167 KHz | 167 KHz/ 12.288ms |
| | Medium | 6.144msec | 333 KHz | 333 KHz/ 6.144ms |
| | Fast | 2.458msec | 1 MHz | 1 MHz/ 2.458ms |
| HiBand VHF and MidBand | Slow | 12.288msec | 167 KHz | 167 KHz/ 12.288ms |
| | Medium | 6.144msec | 333 KHz | 333 KHz/ 6.144ms |
| | Fast | 2.458msec | 1 MHz | 1 MHz/ 2.458ms |
| Super Band | Slow | 2.048msec | 1 MHz | 1 MHz/ 2.048ms |
| | Medium | 1.024msec | 2 MHz | 2 MHz/ 1.024ms |
| | Fast | 0.410msec | 6 MHz | 6 MHz/ 0.410ms |
| UHF | Slow | 2.048msec | 1 MHz | 1 MHz/ 0.048ms |
| | Medium | 1.024msec | 2 MHz | 2 MHz/ 1.024ms |
| | Fast | 0.410msec | 6 MHz | 6 MHz/ 0.410ms |

Thus since, loop frequency resolution is the reciprocal of loop speed, the fast loop is executed in one-sixth the slow loop time and in one-half the time of the medium speed loop. Thus, one-sixth the number of interrupts should be encountered in the high speed loop as in the low speed ramping loop.

Figure 5:
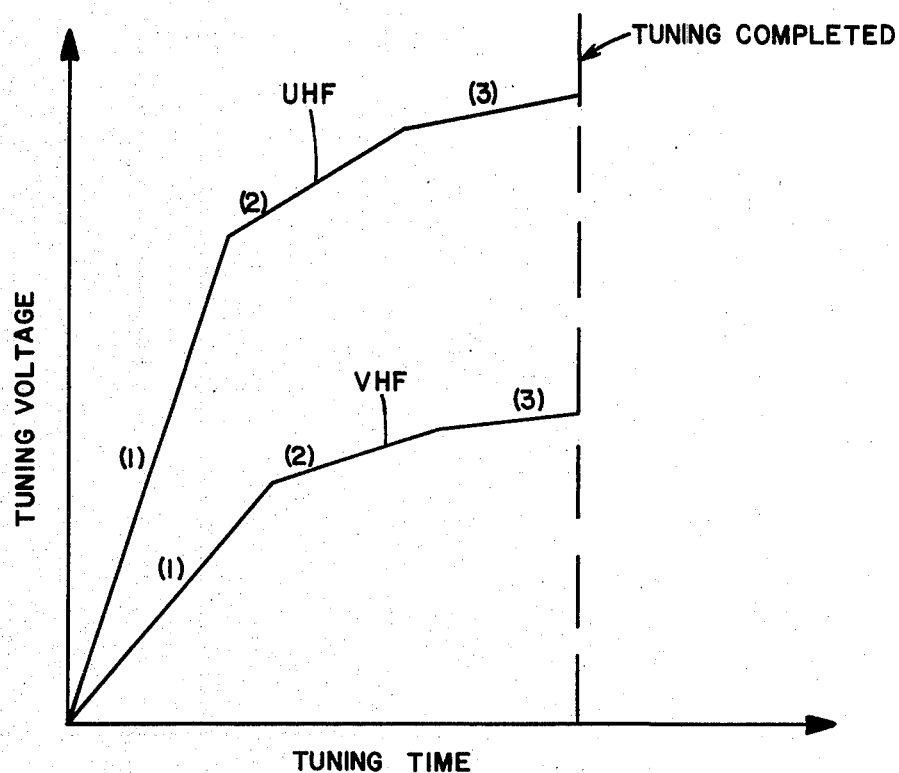
FIG. 5 shows the variable ramp speed utilized in the present invention for rapid channel tuning in the VHF and UHF bands.

If a UHF channel is selected by the user, the counter is run for various time intervals depending upon which ramp speed loop the system is in. Timing intervals of 1880, 940, or 382 microseconds are introduced for the slow, medium and fast ramping rate loops, respectively. These decreasing timing intervals from low to high speed loops provide for the decreasing frequency resolution of the low, medium and high speed loops, respectively. If a VHF channel is selected by the user, the system proceeds to a dummy counter which introduces a 6×multiple of the 1880, 940, or 382 microsecond timing interval for the VHF slow, medium, and fast ramping rates, respectively. The dummy counter is set at 6 and the routine decrements the counter from 6 to 1 and thus adds increasing time intervals to the VHF ramping rate loops. The VHF ramping loops are of greater duration than the UHF loops because of the closer spacing of VHF channels and the need for greater frequency resolution in acquiring VHF channels. Once the dummy counter has been decremented to zero, the variable ramping rate routine checks once again to see if either a UHF or VHF channel has been selected and if a VHF channel has been selected, additional delays of 840, 420 or 138 microseconds are introduced into the routine for the slow, medium, and rapid tuning rate loops, respectively. These timing delays introduce the necessary timing increments for the required frequency resolution at the various loop speeds. Servicing an interrupt requires 28 microseconds which is added to the total counting interval. During an interrupt, the microcomputer increments the interrupt counter and then returns to the flowchart shown in FIG. 4. The routine then checks to determine the number of interrupts detected. If a UHF channel has been selected the routine proceeds directly to an interrupt check and the aforementioned timing delays are not introduced into the routine. The residual contents of the event counter are also checked. Each count in the event counter represents one frequency resolution step. If the number of interrupts detected is zero, less than three, or less than six, for the fast, medium, or slow ramp speed loops, respectively, the frequency of the tuner's local oscillator 28 is very low and a fast ramp-up mode is initiated by resetting the interrupt counter and reloading the event counter with the appropriate entry. The tuning loop is then re-initiated. If the number of interrupts detected is greater than 1, greater than 3 or greater than 6, for the fast, medium, or slow ramping rate loops, respectively, this indicates that the local oscillator frequency is very high and results in the initiation of a ramp-down mode by reloading the event counter and resetting the interrupt counter. If the system detects the correct number of interrupts for the particular speed loop just completed, the system compares the residual count with the correct count and initiates a ramp up if the residue is too large or a ramp down if the residue is too small. The ramp speeds are established by the main tuning program and are fixed prior to entering the flowchart of FIG. 4. The main tuning program proceeds through the fast, medium and slow ramping routines with the program shown in FIG. 4 being a sub-routine called up by the main program. The loop times for the various ramping rates in the UHF and VHF bands as shown in Table 2 which provides a breakdown of the total time of each of the variable ramping speed tuning loops. FIG. 5 illustrates the variable tuning ramp speeds utilized for rapid channel tuning in the VHF and UHF bands as implemented in the present invention.

The manner in which a signal representing the local oscillator frequency is provided to microcomputer 42, the storing of a series of predetermined values representing selected channel numbers, the comparison of these predetermined values with the local oscillator signal frequency, and the generation of an output signal by microcomputer 42 representing the difference between these two frequency values as previously described and as embodied in the present invention involves techniques and components well-known in the art. Numerous applications involving the 3870 Microcomputer where various signal characteristics are sampled, compared with stored signal information, and used to generate signals representing the resulting difference signal are well-known in the signal processing arts. What distinguishes the present invention from the prior art is the unique way in which ramping speed and frequency measuring resolution are manipulated in a digital counting loop sequence in the signal scanning mode of a television receiver tuning system to permit the rapid and efficient tuning to a selected channel.

Figure 6:
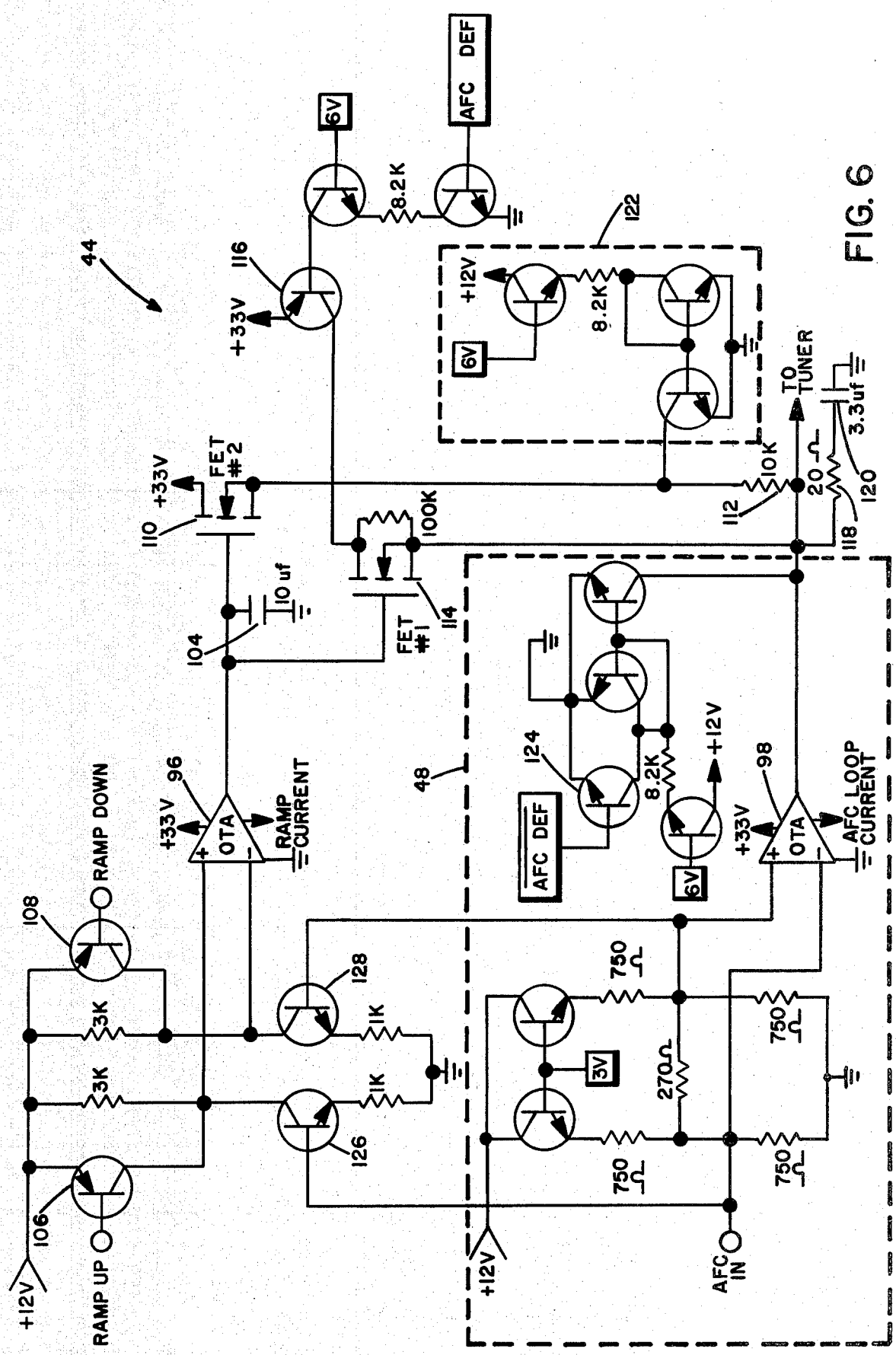
FIG. 6 is a circuit diagram of the ramp circuit for providing the tuning voltage to the tuner in acquiring the selected channel in accordance with the present invention.

Based upon the comparison of the tuner local oscillator frequency and a pre-set, stored frequency value representing the selected channel, microcomputer 42 provides a high, medium, or low speed ramping signal to ramping circuit 44 as shown in FIG. 6. The ramping circuit shown in FIG. 6 is conventional in design, thus only a general description of its operation and major components will be provided. The primary components or ramping circuit 44 are upper and lower operational transconductance amplifiers (OTA) 96 and 98, respectively.

TABLE II

| LOOP TIMING | |
|---|---|
| High Ramp Rate: | Time Required for 1 Interrupt |
| UHF (PATH A) | (1) × 382 usec + 28 usec = 410 microsec. |
| VHF (PATH A) | (6) × 382 usec + 138 usec + 28 usec = 2458 microsec |
| Medium Ramp Rate: | Time Required for 3 Interrupts |
| UHF (PATH A) | (1) × 940 usec + (3) × 28 usec = 1024 microsec |
| VHF (PATH B) | (6) × 940 usec + 420 usec + (3) × 28 usec = 6144 microsec |
| Slow Ramp Rate: | Time Required for 6 Interrupts |
| UHF (PATH A) | (1) × 1880 usec + (6) × 28 usec = 2048 microsec |
| VHF (PATH B) | (6) × 1880 usec + 840 usec + (6) × 28 usec = 12288 microsec |

Figure 8:
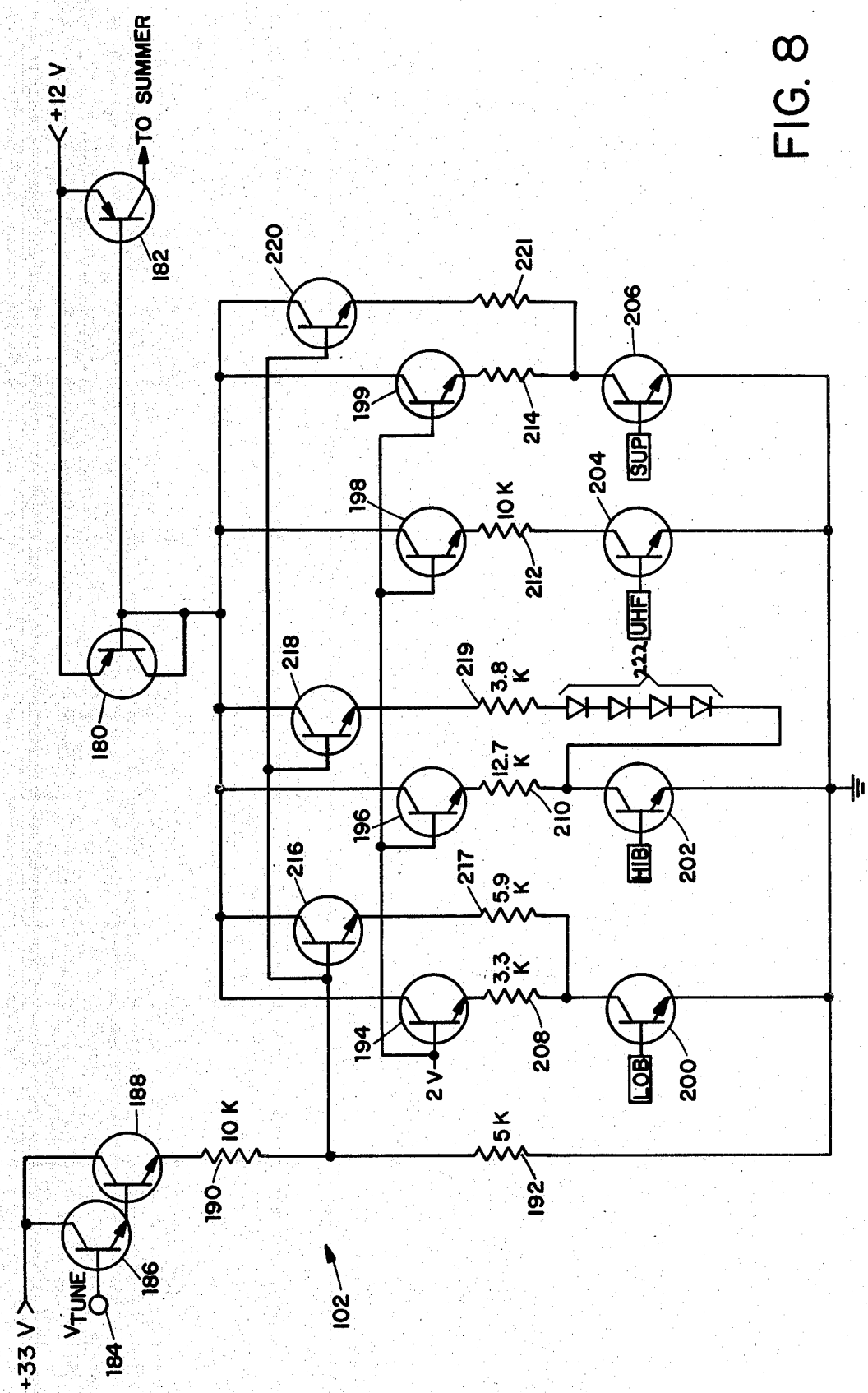
FIG. 8 is a schematic diagram of a programmable current source for providing the proper current in the lower operational transconductance amplifier of FIG. 6 to maintain the gain of the AFC feedback loop within the range required for its proper operation.
Figure 9:
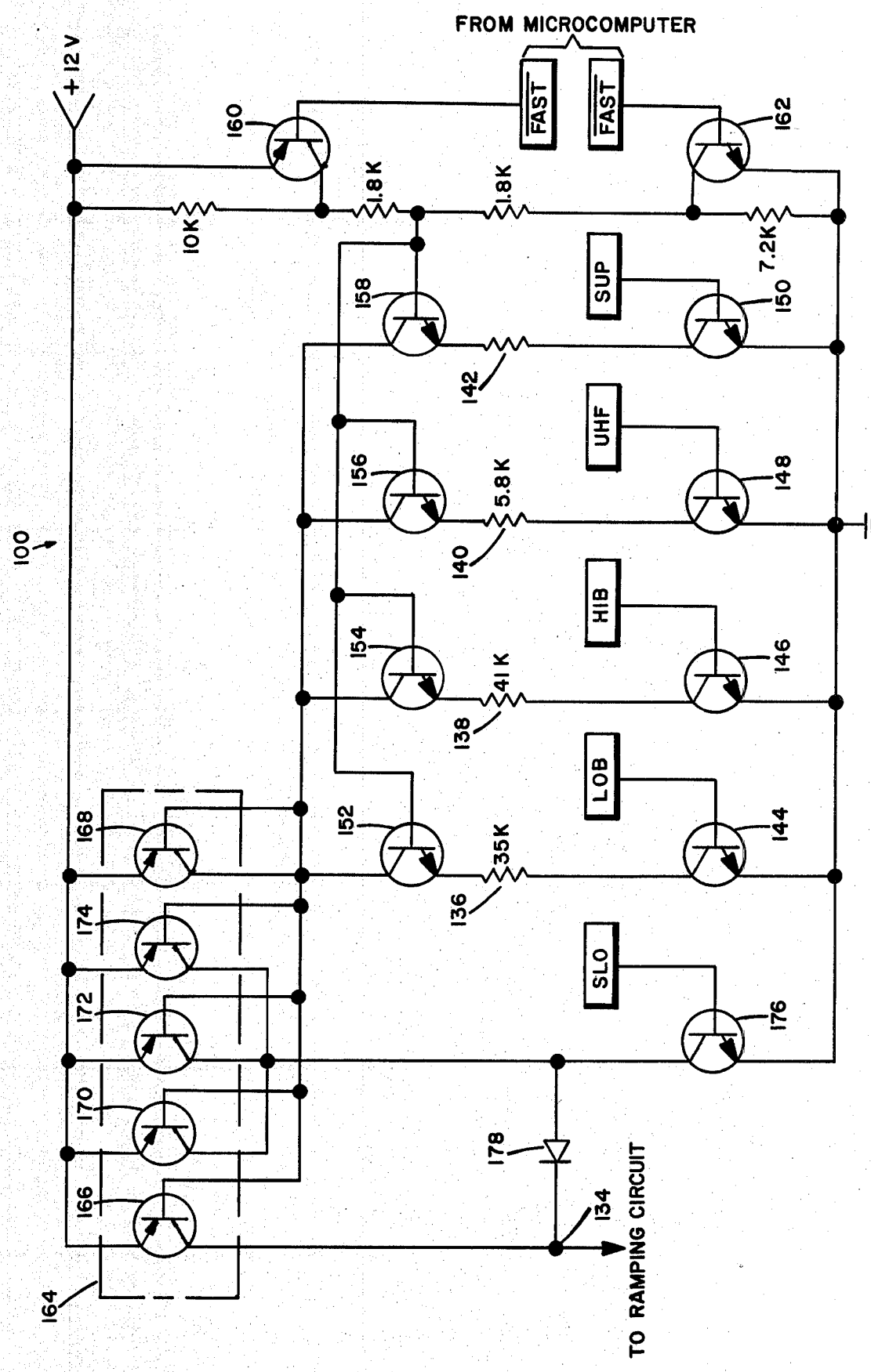
FIG. 9 is a schematic diagram of a programmable current source for providing the current to the upper operational transconductance amplifier of FIG. 6 required for the proper ramping speed in tuning to the selected channel.

OTA 96 receives its bias current from ramp rate control circuit 100 shown in FIG. 9 while OTA 98 receives its bias current from the AFC loop control circuit 102 shown in FIG. 8.

OTA 96 generates a ramping voltage by charging 10 microfarad capacitor 104 at its output. The tuning voltage is ramped up and down by the switching on and off of PNP transistors 106 and 108 connected to the inputs of OTA 96. With transistor 106 rendered conductive, tuner 28 is ramped up. With transistor 106 in a conducting state, tuner 28 is ramped downward. The inputs to the bases of transistors 106 and 108 are provided by microcomputer 42. The ramping current is either being provided to or removed from capacitor 104 in the form of biasing current to OTA 96 by ramp rate control circuit 100. The voltage on 10 microfarad capacitor 104 is applied to the gate of field-effect transistor (FET) 111 which acts as a voltage follower to eliminate any voltage across resistor 112 during ramping only. Thus, the voltage on capacitors 104 and 120 is ramped up and down at the desired tuning rate. FET 114, which is coupled to the AFC defeat line and will thus be turned on during ramping, acts a low resistance switch between capacitor 104 and the filter network made up of 20 ohm resistor 118 and 3.3 microfarad capacitor 120. The selective switching on of FET 114 during tuner ramping thus allows the filter network required for the AFC operation to be disabled during ramping. Presence of the filter network in the AFC loop during ramping would make ramping unstable, however, AFC loop operation is unstable without this filtering. Shorting out resistor 112 disables the filter during ramping permitting the stable operation of both ramping and AFC loops. Current source 122 maintains FET 110 on at all times.

Figure 7:
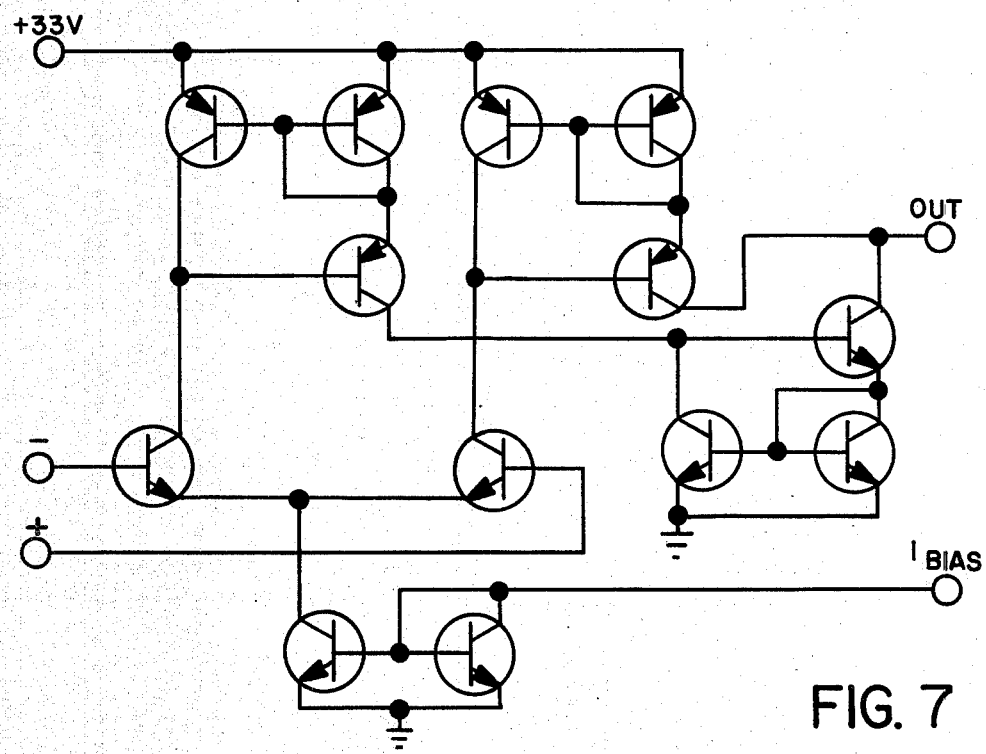
FIG. 7 is a schematic of the operational transconductance amplifiers of conventional design utilized in the ramping circuit shown in FIG. 6.

OTA 98 and associated circuitry comprise signal summer 48. The AFC voltage is provided to the input of OTA 98 which is biased by AFC loop control circuit 102. When AFC 34 is enabled FET 114 is rendered nonconducting switching ramp circuit 44 out of the tuning system. An AFC not defeat signal is provided to the base of transistor 124 and providing a bias current for maintaining FET 114 on and in a conducting state during ramping. The AFC input to ramping circuit 44 is provided through NPN transistors 126 and 128 which permits the AFC to compensate for leakages or other errors at ramping capacitor 104. AFC input biasing to OTA 98 is provided by NPN transistors 130 and 132. OTA's 96 and 98 are of conventional design with the CA 3080 OTA as manufactured by RCA of New York, N.Y., utilized in the preferred embodiment of the present invention. FIG. 7 presents the details of OTA's 96 and 98 where +33V is applied to both OTA's and current biasing is provided by ramp current source 100 in the case of OTA 96 and AFC loop current source 102 in the case of OTA 98.

Ramp rate control circuit 100 shown in FIG. 9 provides the biasing current to OTA 96 required for the proper ramping speed. The circuit must provide either full current for the band to OTA 96 (full ramping speed), or 1/9th of full current (medium ramping speed), or 1/36th of full current (slow ramping speed) into the ramp rate control circuit node 134. It does this either by varying the voltage across resistors 136, 138, 140 and 142 in the band branches or by shunting the necessary amount of current to ground. The ramp rate control circuit 100 receives digital control signals from microcomputer 42. Band control signals are provided to transistors 144, 146, 148 and 150 from microcomputer 42. VHF low band is controlled by transistor 144, VHF high band is controlled by transistor 146, UHF is controlled by transistor 148, and super band is controlled by transistor 150. When the appropriate digital input is provided to the base of one of these respective transistors, corresponding transistor 152, 154, 156 or 158 is turned on causing current to flow through its collector. By the selective turning on of these coupled transistors and applying a voltage across the resistance between adjacent transistors, the correct ramping speed is selected in accordance with the band being tuned to. Fast and medium ramping speeds are provided by microcomputer 42 applying the appropriate input to either PNP transistors 160 or NPN transistor 162. For fast ramping speeds transistor 160 is turned on and transistor 162 is turned off. This increases the voltage applied to the bases of transistors 152, 154, 156 and 158 producing increased voltage across the emitter resistors causing more current to flow in the collectors of these four transistors. This results in an increased ramping current. Medium speed is provided by turning transistor 160 off and rendering transistor 162 conductive which results in a decreased current flow in the collectors of transistors 152, 154, 156 and 158 and a reduction in the current provided to the PNP transistor combination 164 and hence to the ramp rate control circuit mode 134. Medium and fast ramping speeds are thus provided by changing the voltage applied to the bases of transistors 152, 154, 156 and 158 by selectively switching transistors 160 and 162 on and off in combination.

For slow ramping speeds transistor 160 is turned off by the input signal from microcomputer 42 while transistor 162 is turned on just as in the previously discussed medium speed configuration. PNP transistor combination 164 permits switching between medium and slow ramping speeds in the following manner. Transistors 166 and 168 in combination, without the three intermediate transistors present, form a current mirror. Thus, without transistors 170, 172 and 174 present, the current flowing out of the ramp rate control circuit 100 would be equal to the current flowing in the collectors of transistors 152, 154, 156 and 158. But with transistors 170, 172 and 174 coupled between transistors 166 and 168, the current in the collectors of transistors 152, 154, 156 and 158 is multiplied by a factor of 4 in producing the ramp rate control current. But the combination of transistors 170, 172 and 174 is collectively coupled to "slow" transistor 176 the base of which is coupled to microcomputer 42 for receiving a slow ramping rate control signal. This slow ramp rate control signal turns transistor 176 on and off such that when transistor 176 is on, the current flowing through the collectors of transistors 170, 172, and 174 is shunted through transistor 176 with the result that the current at node point 134 is reduced to $\frac{1}{4}$th of its value when transistor 176 is off. With transistor 176 in a non-conducting state, the collector current of transistors 152, 154, 156 and 158 is multiplied by a factor of 4 by the inclusion of transistors 170, 172 and 174 in the PNP amplifying circuit 164. This configuration produces the medium speed ramping rate with an output ramping current 4 times the low speed ramping rate current where the output current of transistors 170, 172 and 174 is transmitted through diode 178 and ramp rate control circuit mode 134 to OTA 96 of the ramping circuit 44.

AFC loop control circuit 102 shown in FIG. 8 controls OTA 98 by providing the proper current thereto for required biasing in keeping the gain of the AFC feedback loop within the range required for proper system operation. The specific tuning band is selected by turning on a particular transistor combination in AFC loop control circuit 102 and feeding the current into the PNP current mirror comprised of transistors 180 and 182. The tuning voltage is also fed into the AFC loop control circuit to provide the required inband equalization. More specifically, the tuning voltage is provided to tuning voltage node 184 and thence to the darlington pair comprised of transistors 186 and 188. The tuning voltage is then divided down by the combination of resistors 190 and 192 and provided to the bases of transistors 216, 218 and 220. When a band select signal is received by the base of transistor 200, 202, 204 or 206 from microcomputer 42, that transistor is rendered conducting which, in turn, turns on one of the associated NPN transistors 194, 196, 198 or 199. Each of these transistors, in turn, is coupled to an emitter resistor 208, 210, 212 and 214, respectively, which is switched in when its corresponding transistor is turned on. By selectively switching in one of the emitter resistors, all of which have different resistance values, the current provided to the current mirror of transistors 180 and 182 can be varied depending upon the frequency band selected which provides the required AFC loop current biasing for OTA 98. Transistors 216, 218 and 220, and associated resistors 217, 219 and 221, are selectively incorporated in the circuit to compensate for tuning voltage verses frequency nonlinearities in the tuner utilized. With the tuning voltage applied to the bases of transistors 216, 218 and 220, band select signals from microcomputer 42 provided to base of one of transistors 200, 202, 204 or 206, will render one of transistors 216, 218 or 220 respectively conducting and introduce resistor 217, 219 or 214, respectively, into the circuit. The selective introduction of one of these transistors with an associated resistor in AFC loop control circuit 102 provides for equalization of AFC loop gain over the entire frequency operating range and thus compensates for non-linearities in the tuning voltage versus frequency response curve. This compensating current is used to bias OTA 98 thus providing for the gain equalization of signal summer 48 over the entire tuning voltage range. Diode combination 222 is incorporated to ensure that no equalization occurs until the tuning voltage exceeds 5 diode drops as applied to the base of transistor 218 for high band VHF spectrum.

There has thus been shown in a microcomputer-controlled frequency synthesis television tuning system capable of rapidly tuning to a desired channel following channel selection. The tuner initially scans at very high speed with subsequent reductions in scan speed as the selected channel's frequency is approached.

While particular embodiments of the present invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention. The matter set forth in the foregoing description and the accompanying drawings is offered by way of illustration only and not as a limitation. The actual scope of the invention is intended to be defined in the following claims when viewed in their proper perspective base on the prior art.

We claim:

1. In a signal seeking television tuning system including tuning means for developing a local oscillator signal, channel selector means for providing signals representative of a selected VHF, UHF or CATV television channel to said tuning means, mixer means for combining said local oscillator signal with a received television signal in generating an intermediate frequency signal, automatic frequency control means coupled to said mixer means for detecting the video components of said intermediate frequency signal and for locking said tuning means to the carrier frequency of said received television signal, a system for providing a tuning voltage to said tuning means comprising:

frequency divider means coupled to said tuning means for generating a divided-down local oscillator signal;

variable, programmable counter means coupled to said frequency divider means for receiving and measuring the frequency of said divided-down local oscillator signal with a given frequency measuring resolution;

counter control means coupled to said programmable counter means for changing the frequency measuring resolution of said programmable counter, said counter control means including:

loading means for sequentially providing a plurality of control inputs to said programmable counter means with the counting interval of said counter means changed in response thereto, wherein each successive counting interval is of increasing duration; and clock generator means for applying a clock pulse train to said counter means during each of said counting intervals, the duration of each of said counting intervals determining the frequency measuring resolution of said counter means, with the frequency measuring resolution of said counter means increasing with increasing counting interval duration;

programmable comparator means coupled to said counter means for comparing the divided-down local oscillator signal frequency with a predetermined frequency representing a selected channel and for generating a tuning voltage correction signal representing the difference between said frequencies; and variable ramp voltage generating means coupled to said comparator means and to said tuning means for receiving said tuning voltage correction signal, developing a tuning voltage signal in response thereto, and providing said tuning voltage signal to said tuning means in ramping said divided-down local oscillator signal toward said predetermined frequency representing the selected television channel at a given ramping rate, the ramping rate of said ramp voltage generating means being successively decreased in a step-wise manner when the frequency difference between said local oscillator signal and said received television signal is within the frequency measuring resolution of said counter means in rapidly tuning said television receiver to said selected channel.

2. A system as in claim 1 wherein said counter control means provides three separate counting intervals and clock pulse trains to said counter means, with each successive counting interval of increasing duration and each successive frequency comparison in said comparator means having increasing frequency resolution in providing a three step ramping voltage to said ramp voltage generating means with each successive ramping rate of decreasing magnitude.

3. A system as in claim 2 further comprising timing delay means coupled to said loading means for decreasing counting interval duration when a UHF or CATV channel is selected thus increasing the ramping rate of said ramp voltage generating means over the UHF and CATV bands.

4. A system as in claim 3 wherein said loading means sequentially provides counting intervals of 2.458, 6.144 and 12.288 milliseconds to said counter means when a VHF channel is selected and sequentially provides counting intervals of 0.41, 1.024 and 2.048 milliseconds to said counter means when a UHF or CATV channel is selected resulting in frequency resolutions for the respective high, medium and low ramping speeds of 1 MHz, 333 KHz and 167 KHz over the VHF band and 6, 2 and 1 MHz over the UHF and CATV bands.

5. In a signal seeking television tuning system including tuning means for developing a local oscillator signal, channel selector means for providing signals representative of a selected VHF, UHF or CATV television channel to said tuning means, mixer means for combining said local oscillator signal with a received television signal in generating an intermediate frequency signal, automatic frequency control means coupled to said mixer means for detecting the video components of said intermediate frequency signal and for locking said tuning means to the carrier frequency of said received television signal, a system for providing a tuning voltage to said tuning means comprising:

frequency divider means coupled to said tuning means for generating a divided-down local oscillator signal;

variable, programmable counter means coupled to said frequency divider means for receiving and measuring the frequency of said divided-down local oscillator signal with a given frequency measuring resolution;

counter control means coupled to said programmable counter means for changing the frequency measuring resolution of said programmable counter means, said counter control means including:

loading means for sequentially providing a plurality of control inputs to said programmable counter means with the counting interval of said counter means changed in response thereto, wherein each successive counting interval is of increasing duration;

clock generator means for applying a clock pulse train to said counter means during each of said counting intervals, the duration of each of said counting intervals determining the frequency measuring resolution of said counter means, with the frequency measuring resolution of said counter means increasing with increasing counting interval duration; and timing delay means coupled to said loading means for decreasing counting interval duration when a UHF or CATV channel is selected;

programmable comparator means coupled to said counter means for comparing the divided-down local oscillator signal frequency with a predetermined frequency representing a selected channel and for generating a tuning voltage correction signal representing the difference between said frequencies; and variable ramp voltage generating means coupled to said comparator means and to said tuning means for receiving said tuning voltage correction signal, developing a tuning voltage signal in response thereto, and providing said tuning voltage signal to said tuning means in ramping said divided-down local oscillator signal toward said predetermined frequency representing the selected television channel at a given ramping rate, the ramping rate of said ramp voltage generating means being successively decreased in a step-wise manner when the frequency difference between said local oscillator signal and said received television signal is within the frequency measuring resolution of said counter means in rapidly tuning said television receiver to said selected channel with higher sequential ramping rates employed in tuning to a UHF or CATV channel and lower sequential ramping rates employed in tuning to a VHF channel.

* * * * *